(12) United States Patent
Nelson

(10) Patent No.: US 11,022,628 B2
(45) Date of Patent: Jun. 1, 2021

(54) PROBE CARD SUPPORT APPARATUS FOR AUTOMATIC TEST EQUIPMENT

(71) Applicant: Reid-Ashman Manufacturing, Inc., St. George, UT (US)

(72) Inventor: Scott Nelson, Phoenix, AZ (US)

(73) Assignee: Reid-Ashman Manufacturing, Inc., St. George, UT (US)

( * ) Notice: Subject to any disclaimer, the term of this patent is extended or adjusted under 35 U.S.C. 154(b) by 0 days.

(21) Appl. No.: 16/570,819

(22) Filed: Sep. 13, 2019

(65) Prior Publication Data

US 2020/0003803 A1  Jan. 2, 2020

(51) Int. Cl.
*G01R 31/28* (2006.01)
*G01R 1/073* (2006.01)
*G01R 1/04* (2006.01)

(52) U.S. Cl.
CPC ....... *G01R 1/07342* (2013.01); *G01R 1/0408* (2013.01); *G01R 31/2831* (2013.01)

(58) Field of Classification Search
CPC ............ G01R 1/07342; G01R 31/2831; G01R 1/0408
USPC ...................................... 324/750.25
See application file for complete search history.

(56) References Cited

U.S. PATENT DOCUMENTS

| | | | | |
|---|---|---|---|---|
| 4,038,599 A | * | 7/1977 | Bove ................ | G01R 1/07314 324/754.11 |
| 5,559,446 A | * | 9/1996 | Sano .................... | G01R 1/0735 324/750.03 |
| 5,666,063 A | * | 9/1997 | Abercrombie ..... | G01R 1/07342 29/885 |
| 6,876,215 B1 | * | 4/2005 | Hannan .............. | G01R 31/2886 324/750.22 |
| 7,098,650 B2 | | 8/2006 | Foster et al. | |
| 7,746,089 B2 | * | 6/2010 | Hobbs ................ | G01R 1/07364 324/750.25 |
| 9,134,357 B1 | * | 9/2015 | Fox ...................... | G01R 1/0433 |
| 2003/0201764 A1 | | 10/2003 | Jafari et al. | |
| 2006/0238210 A1 | * | 10/2006 | Goto .................. | G01R 31/2889 324/756.03 |
| 2008/0209720 A1 | * | 9/2008 | Kim .................... | G01R 1/07342 29/842 |
| 2010/0126289 A1 | * | 5/2010 | Kinoshita .......... | G01R 1/07342 73/866.5 |
| 2011/0241716 A1 | * | 10/2011 | Doi .................... | G01R 31/2889 324/756.03 |
| 2012/0126843 A1 | | 5/2012 | Shibahara | |
| 2017/0248632 A1 | * | 8/2017 | Thompson ......... | G01R 31/2875 |
| 2019/0265272 A1 | * | 8/2019 | Hyakudomi ....... | G01R 31/2867 |
| 2020/0191829 A1 | * | 6/2020 | Kudo .................. | H01R 12/714 |

\* cited by examiner

*Primary Examiner* — Jeff W Natalini
(74) *Attorney, Agent, or Firm* — Holland & Hart LLP

(57) ABSTRACT

Various implementations of automatic test equipment are disclosed having a number of innovative features. In one implementation, the equipment includes a test head having a probe card support apparatus that provides stiffening support and/or planarization to the device under test (DUT) area of a probe card. In another implementation, the test head can include a planar surface and the wafer prober can include a corresponding planar surface. The planar surfaces can be brought into contact with each other to planarize the DUT area of the probe card and the wafer chuck in the wafer prober relative to each other.

24 Claims, 10 Drawing Sheets

PROBE CARD SUPPORT APPARATUS FOR AUTOMATIC TEST EQUIPMENT

TECHNICAL FIELD

This relates to automatic test equipment used to test electronic equipment, devices, units, and the like. This especially relates to automatic test equipment including a test head having a probe card support apparatus.

BACKGROUND

Manufacturers in the electronics industry use automatic test equipment to test various electronic components, integrated circuits (ICs) and other devices under test (DUTs) to cull out defective devices. Generally, it is desirable to test ICs at several points during the manufacturing process, including while they are still part of a wafer or substrate.

Automatic test equipment can include a wafer prober and an automated test unit. A conventional wafer prober has a movable chuck which moves the wafer to a position underneath a probe card mounted to the top deck of the wafer prober. A probe array is provided on the underside of the probe card for engaging the bonding pads of one or more die on the wafer. A plurality of contact elements, electrically coupled with the probe array, are usually provided at the periphery on the top of the probe card. The automated test unit includes one or more testers which overlie the top deck of the wafer prober and have an electrical interface for electrically engaging the contact elements on the probe card.

The probe card can become distorted due to changes in temperature and mechanical forces exerted on it during testing. This can cause deflection of the generally unsupported central portion of the probe card where the probe array is located. The amount of deflection increases with the size of the probe card. Probe card distortion can produce undesirable alignment errors between the probe array of the probe card and the wafer chuck, which compromises the accuracy or completeness of the testing of the die carried by the wafer chuck.

There have been some attempts to reduce distortion of the probe card by attaching a support apparatus to the wafer prober in the vicinity of the area where the probe card interfaces with the DUT. This is problematic, however, because the support apparatus spans across the top center opening of the wafer prober thereby preventing the probe card from being loaded into the wafer prober from the top (aka top-load). This means only wafer probers that load the probe card from the bottom (aka bottom-load) can be used with a conventional support apparatus. Many wafer probers do not have the capability of loading the probe card from the bottom.

SUMMARY

Various implementations of automatic test equipment having a probe card support apparatus are described. The probe card support apparatus can be used to support and planarize a probe card, especially the device under test (DUT) area of the probe card, to an automated test unit and wafer prober. The probe card support apparatus can be used with any size probe card but it is especially suitable for providing stiffening support and planarizing large probe cards.

The probe card support apparatus can be used with both top-load and bottom-load wafer probers. In some implementations, the probe card support apparatus is part of an automated test unit. For example, the probe card support apparatus can be part of a test head of the automated test unit. In some implementations, the probe card support apparatus is not attached to the wafer prober. In either of these implementations, the probe card support apparatus is positioned in a manner that does not interfere with loading the probe card from the top or bottom of the wafer prober. This is important because not all wafer probers are equipped with a bottom probe card change mechanism that loads the probe card from the bottom chamber of the prober.

In some implementations, the probe card support apparatus is connected to the probe card. This can be accomplished in a number of ways. For example, in some implementations, the probe card support apparatus can be fastened to the probe card. The probe card support apparatus can also be connected to any suitable area of the probe card. For example, in some implementations, the probe card support apparatus is connected to the DUT area of the probe card and/or the center of the probe card.

The probe card can be planarized or aligned relative to a wafer chuck in the wafer prober in any of a number of suitable ways. In some implementations, the automated test unit includes a planar surface and the wafer prober includes a corresponding planar surface. The planar surfaces contact each other resulting in the probe card and the wafer chuck being planarized relative to each other.

The systems, methods, and devices of this disclosure each have several innovative aspects, no single one of which is solely responsible for the described desirable attributes. The summary is provided to introduce a selection of concepts in a simplified form that are further described below in the detailed description. The summary and the background are not intended to identify key concepts or essential aspects of the disclosed subject matter, nor should they be used to constrict or limit the scope of the claims. For example, the scope of the claims should not be limited based on whether the recited subject matter includes any or all aspects noted in the summary and/or addresses any of the issues noted in the background.

DRAWINGS

The preferred and other implementations are disclosed in association with the accompanying drawings in which.

DETAILED DESCRIPTION

Figure 1:
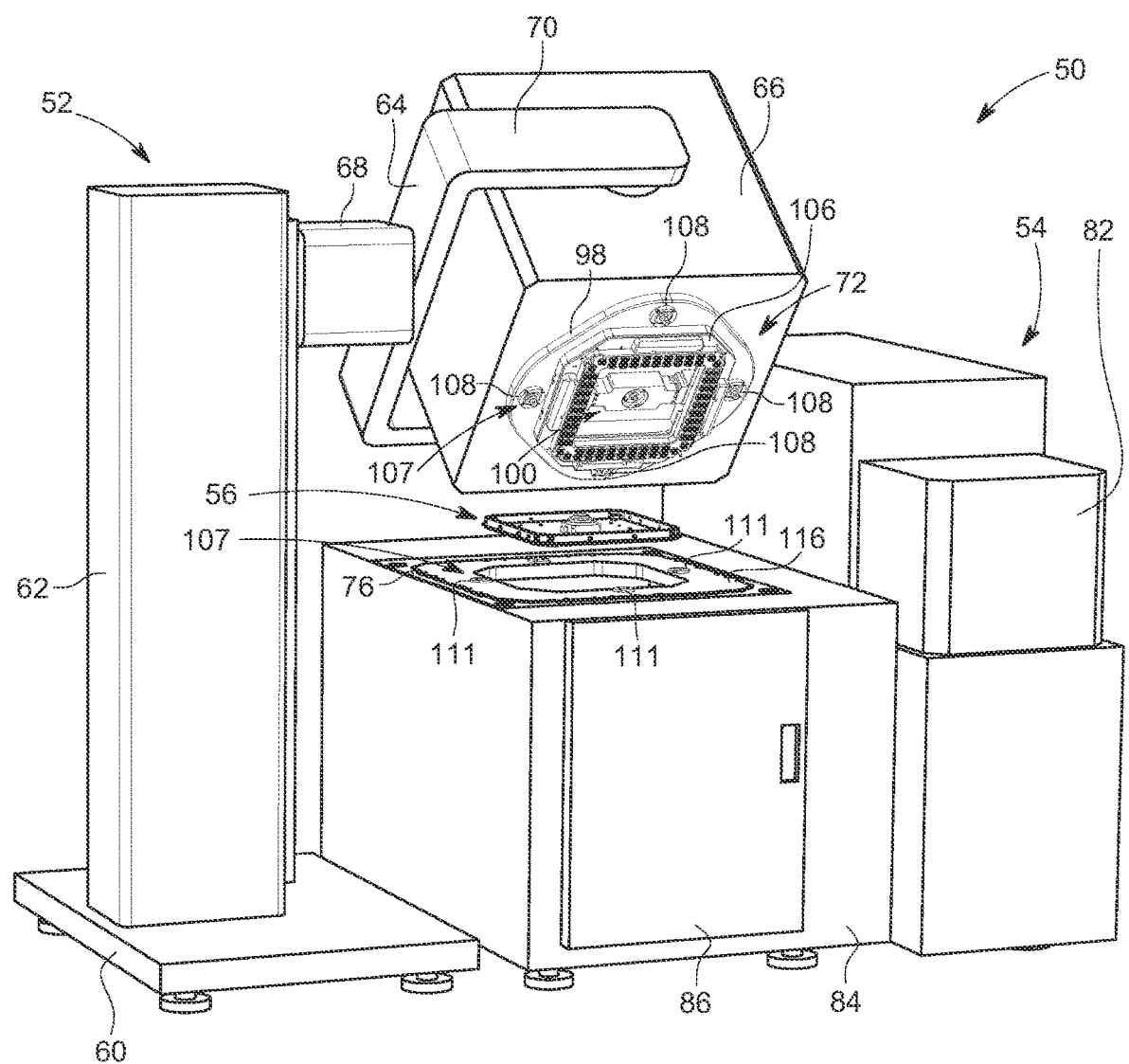
FIG. 1 is a perspective view of one implementation of automatic test equipment including an automated test unit, a top-load wafer prober, and a probe card. The automated test unit includes a test head, which is shown as being raised and rotated relative to the wafer prober.

FIG. 1 shows a perspective view of one implementation of automatic test equipment 50 (alternatively referred to as an automatic test system). It can generally be used to perform tests on different devices referred to as the device under test (DUT) (alternatively referred to as equipment under test (EUT) or unit under test (UUT)). The automatic test equipment 50 includes control systems and automated information technology to rapidly perform tests that measure and evaluate a DUT. For example, the automatic test equipment 50 can be used to run high-level electronic diagnostics such as wafer testing for semiconductor device fabrication or for integrated circuits.

The primary objective of the automatic test equipment 50 is to quickly confirm whether the DUT works and to find defects. Testing the DUT in this manner saves on manufacturing costs and helps prevent a faulty device from entering the market. The automatic test equipment 50 can be used to test a wide variety of DUTs using an equally wide variety of testing procedures.

Figure 5:
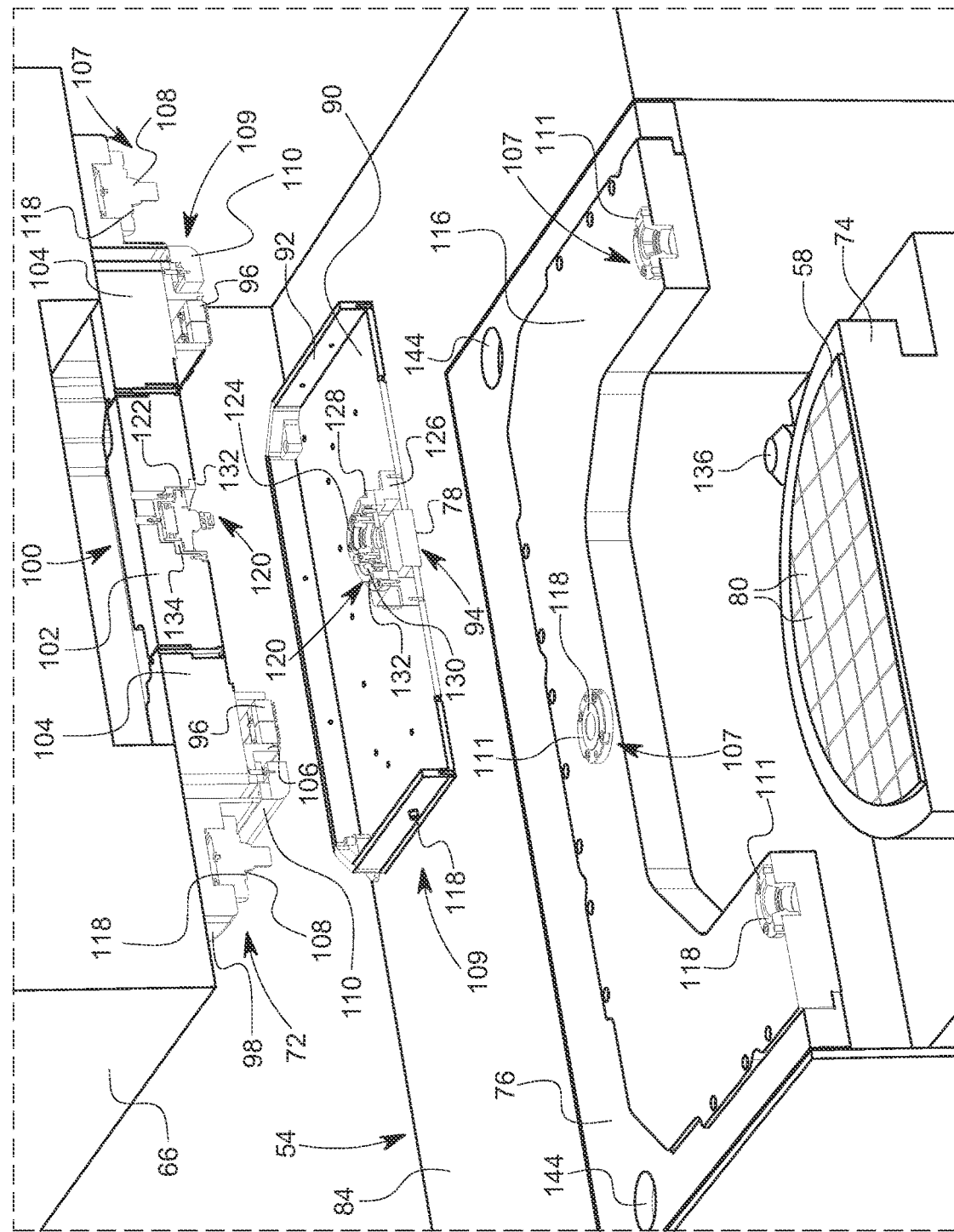
FIG. 5 is a partially exploded, cross-sectional, perspective view of one implementation of automatic test equipment including a test head, a probe card, and wafer prober showing how the test head, probe card, and wafer prober are coupled to each other (second position).

The automatic test equipment 50 in FIG. 1 is configured to test a wafer 58 (FIGS. 5-7) using an automated test unit 52 (alternatively referred to as an automated test system), a wafer prober 54, and a probe card 56 (alternatively referred to as a DUT board, probe board, or device interface board).

The wafer 58 (alternatively referred to as a slice or substrate) can be a thin slice of semiconductor, such as crystalline silicon, used for the fabrication of integrated circuits, solar cells, and the like. The wafer 58 serves as the substrate for microelectronic devices built in and upon it. The wafer 58 can include a plurality of die 80, which are small blocks of semiconducting material on which a given functional circuit (microcircuit) is fabricated. The wafer 58 can be cut into pieces to separate each individual die 80 for packaging as in integrated circuit. The wafer 58 can include a top surface having electrical interconnects such as bonding pads, contact pads, or the like.

It should be appreciated that the automatic test equipment 50 can be used to test other DUTs besides the wafer 58. For example, the automatic test equipment 50 can be used to test any suitable semiconductor and/or electronic device.

In some implementations, the automated test unit 52 includes a manipulator. One example of such a manipulator is shown in FIG. 1 and includes a support base 60, a support post 62, a support arm 64, and a test head 66. The support base 60, the support post 62, and the support arm 64 are used to maneuver the position of the test head 66 relative to the wafer prober 54.

The support post 62 is coupled to and extends upward from the support base 60. In some implementations, the support base 60 and the support post 62 are coupled together in a fixed or immovable manner. In other implementations, the support base 60 and the support post 62 can be coupled together in a movable manner. For example, the support post 62 may be configured to rotate relative to the support base 60 or telescope vertically relative to the support base 60. It should be appreciated that there are numerous ways in which the support base 60 and the support post 62 can be coupled together.

The support arm 64 is coupled to and extends outward from the support post 62. In some implementations the support post 62 and the support arm 64 are coupled together in a fixed or immovable manner. In other implementations, the support post 62 and the support arm 64 can be coupled together in a movable manner. For example, the support arm 64 can be configured to rotate relative to the support post 62 and/or move vertically along the support post 62. It should be appreciated that there are numerous ways in which the support post 62 and the support arm 64 can be coupled together.

The test head 66 can be coupled to the support arm 64 in any of a number of suitable ways. In the implementation shown in FIGS. 1-2, the support arm 64 includes a support arm extension 68 coupled to the support post 62 and a support arm yoke 70 coupled to the test head. The support arm yoke 70 has a generally U-shape and extends partially around at least three sides of the test head 66.

In one implementation, the support arm extension 68 is configured to move vertically along the support post 62, and the support arm yoke 70 is configured to rotate relative to the support arm extension 68. The support arm 64 can be used to raise and lower the test head 66 by raising and lowering the support arm extension 68. It can also be used to rotate the test head 66 forward and backward (rotation being around an x axis) by rotating the support arm yoke 70 relative to the support arm extension 68. It can also be used to rotate the test head 66 side to side (rotating being around a z axis) by rotating the test head 66 relative to the support arm yoke 70.

Figure 2:
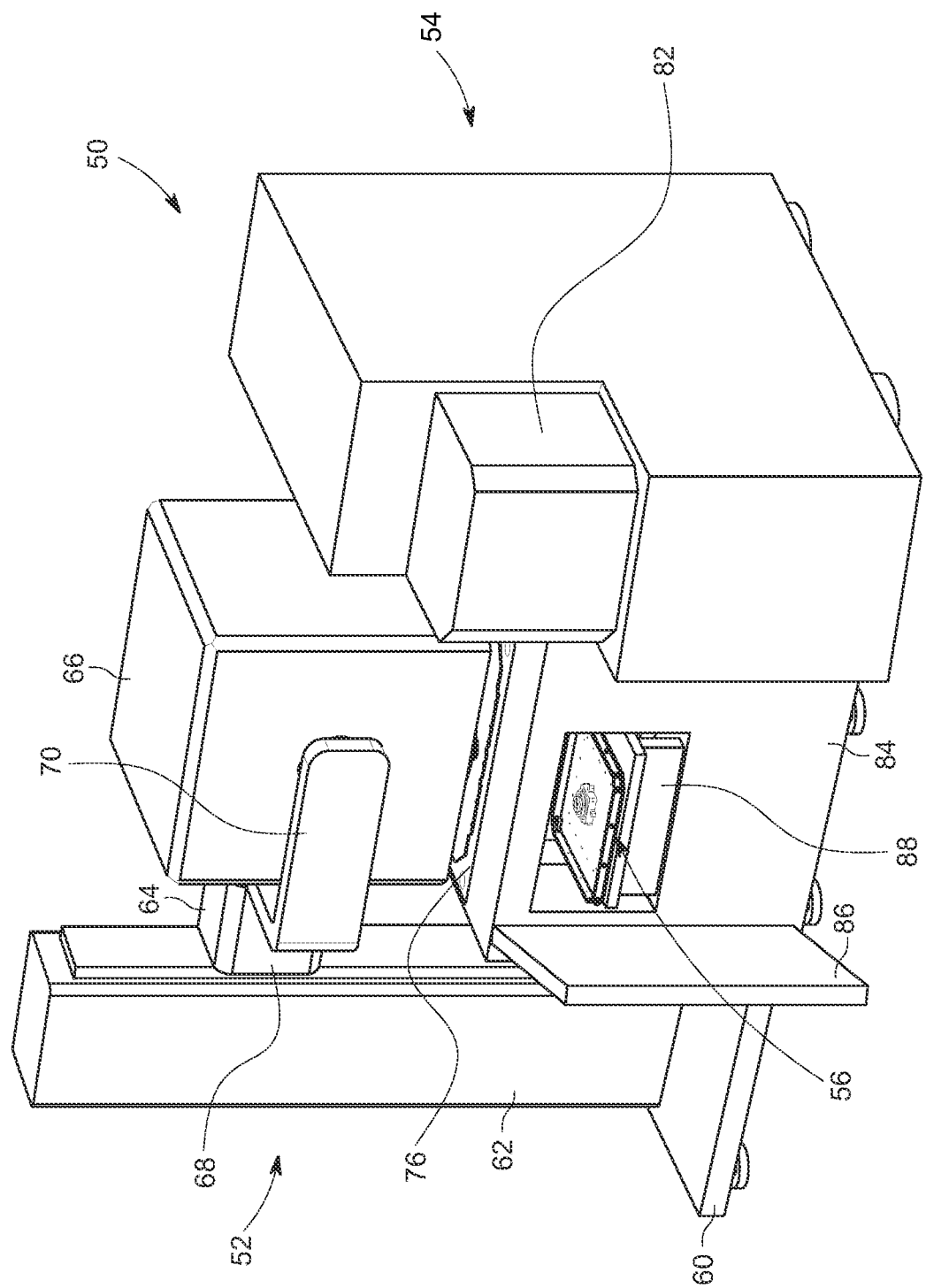
FIG. 2 is a perspective view of another implementation of automatic test equipment including an automated test unit, a bottom-load wafer prober, and a probe card.

FIG. 1 shows the support arm 64 in a raised position and the bottom of the test head 66 is rotated forward to expose a tester docking area 72. FIG. 2 shows the support arm 64 in a lowered position where the test head 66 is positioned on the wafer prober 54.

It should be appreciated that the automated test unit 52 can be implemented in numerous ways beyond what is shown in FIGS. 1-2. For example, the different components of the automated test unit 52 can be combined or integrated together in various ways. Alternatively, the automated test unit 52 can be configured to include additional components beyond what is shown in FIGS. 1-2. In general, the automated test unit 52 can have any suitable configuration capable of effectively maneuvering the test head 66 relative to the wafer prober 54.

The automated test unit 52 can also include a test system, which includes computer hardware and/or software used to perform tests on the DUTs. The test system can be programmed to, among other things, send electronic signals to the DUT, receive response signals from the DUT, and analyze the signals to determine whether the DUT works appropriately or contains one or more defects.

The wafer prober 54 is configured to receive and hold the wafer 58 in a wafer chuck 74. The wafer prober 54 is also configured to attach to the test head 66 (which is attached to the probe card 56) on a prober top plate 76, which is planar and parallel to the top surface of the wafer chuck 74. The wafer prober 54 uses the wafer chuck 74 to move a DUT or array of DUTs on the wafer 58 into electrical contact with the probe card 56 for testing. In some implementations, this involves moving one die 80 or an array of die 80 on the wafer 58 into contact with a corresponding probe array 78 on the underside of the probe card 56. After each DUT or array of DUTs is tested, the wafer prober 54 moves the wafer 58 to test another DUT or array of DUTs.

In addition to the prober top plate 76, the wafer prober 54 also includes a wafer loader 82 and a housing 84 having an access door 86. The wafer loader 82 is used to load and unload the wafers 58 from a carrier or cassette (not shown) inside the wafer loader 82 to the wafer chuck 74.

In some implementations, the wafer prober 54 includes an optical alignment system capable of aligning the wafer 58 and the probe array 78 with sufficient accuracy to accurately register the electrical interconnects on the wafer 58 and the tips on the probe array 78. The optical alignment system can include a camera 136 that optically locates alignment points and uses this information to align the DUT and the probe array 78.

In one implementation, shown in FIG. 1, the wafer prober 54 is a top-load wafer prober—e.g., the probe card 56 is loaded through the top of the prober top plate 76. In another implementation, as shown in FIG. 2, the wafer prober 54 is a bottom-load wafer prober—e.g., the probe card 56 is loaded from the bottom of the prober top plate 76 using a probe card change mechanism 88. In other implementations, the wafer prober 54 can load the probe card 56 from the top and the bottom.

The probe card 56 functions as the electrical interface between the test system in the automated test unit 52 and the DUT. The probe card 56 is designed to meet both the mechanical and electrical requirements of the automated test unit 52 and the DUT. The purpose of the probe card 56 is to provide an electrical path between the test system and the circuits on the wafer 58. This facilitates testing and validation of the circuits at the wafer level, usually before, but sometimes after, they are diced and packaged.

The probe card 56 can be thought of conceptually as a custom connector that takes the universal pattern of the test head 66 and translates the signals to connect to electrical pads on the wafer 58. In many situations, the probe card 56 is custom designed for a given DUT. For example, a different probe card 56 is often required to test different wafers 58. Also, one type of probe card 56 can be used to test the individual die on the wafer 58 and another type can be used to test packaged integrated circuits.

The probe card 56 includes a printed circuit board 90, a probe card frame 92 (alternatively referred to as a probe card stiffener), and a DUT area 94 as shown in FIGS. 3-6. The probe card frame 92 is positioned around the perimeter of the printed circuit board 90 and serves to support and stiffen the printed circuit board 90. The DUT area 94 is the portion of the probe card 56 that contacts the DUT. It is located approximately in the center of the printed circuit board 90 and/or the probe card 56.

The probe card 56 electrically engages and interfaces with the electrical interconnects on the wafer 58 through the probe array 78. The probe array 78 is positioned on the bottom of the probe card 56 in the DUT area 94. The probe array 78 can be sized to test one or more (an array) DUTs at a time.

Figure 6:
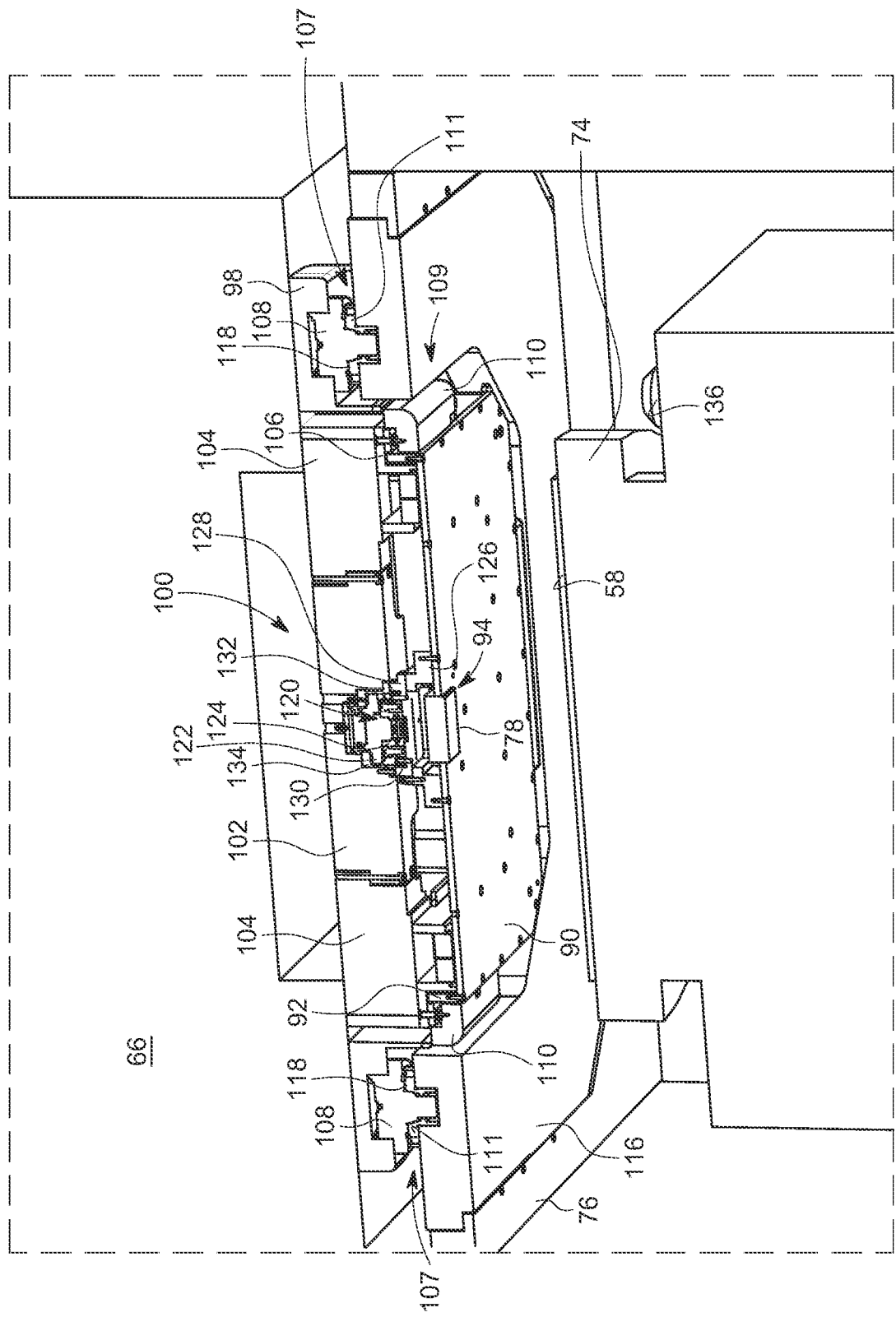
FIG. 6 is a cross-sectional, perspective view of the test head, the probe card, and the wafer prober in FIG. 5 coupled together (first position).

The probe card 56 electrically engages and interfaces with the test head 66 through contact elements or contact pads (not shown) that engage test pins 96 on the test head 66. The contact elements are electrically coupled to the probe array 78 and are generally positioned on top of the probe card 56 along the outside periphery adjacent to the probe card frame 92 (FIG. 6).

It should be appreciated that the implementation of the probe card 56 shown in FIGS. 3-6 is only one of many possible implementations. For example, the printed circuit board 90 can be replaced by another type of electrical interface. Also, the DUT area 94 can be positioned somewhere other than in the center of the printed circuit board 90. The probe card frame 92 can have other configurations such as, for example, it can include portions extending across one or more areas of the printed circuit board 90. The probe card 56 can also be a needle type, vertical type, MEMS (Micro Electro-Mechanical System) type, or other type probe card.

The probe card 56 can have any suitable shape and/or size. The probe card 56 shown in FIGS. 1-2 has a generally rectangular shape. However, it should be appreciated that the probe card 56 can also have other shapes such as a generally square shape, generally round shape, generally oblong shape, or the like. In some implementations, the probe card 56 can be relatively large. For example, the probe card 56 can have an overall area of at least 150 in$^2$, at least 170 in$^2$, at least 190 in$^2$, or at least 200 in$^2$.

Figure 3:
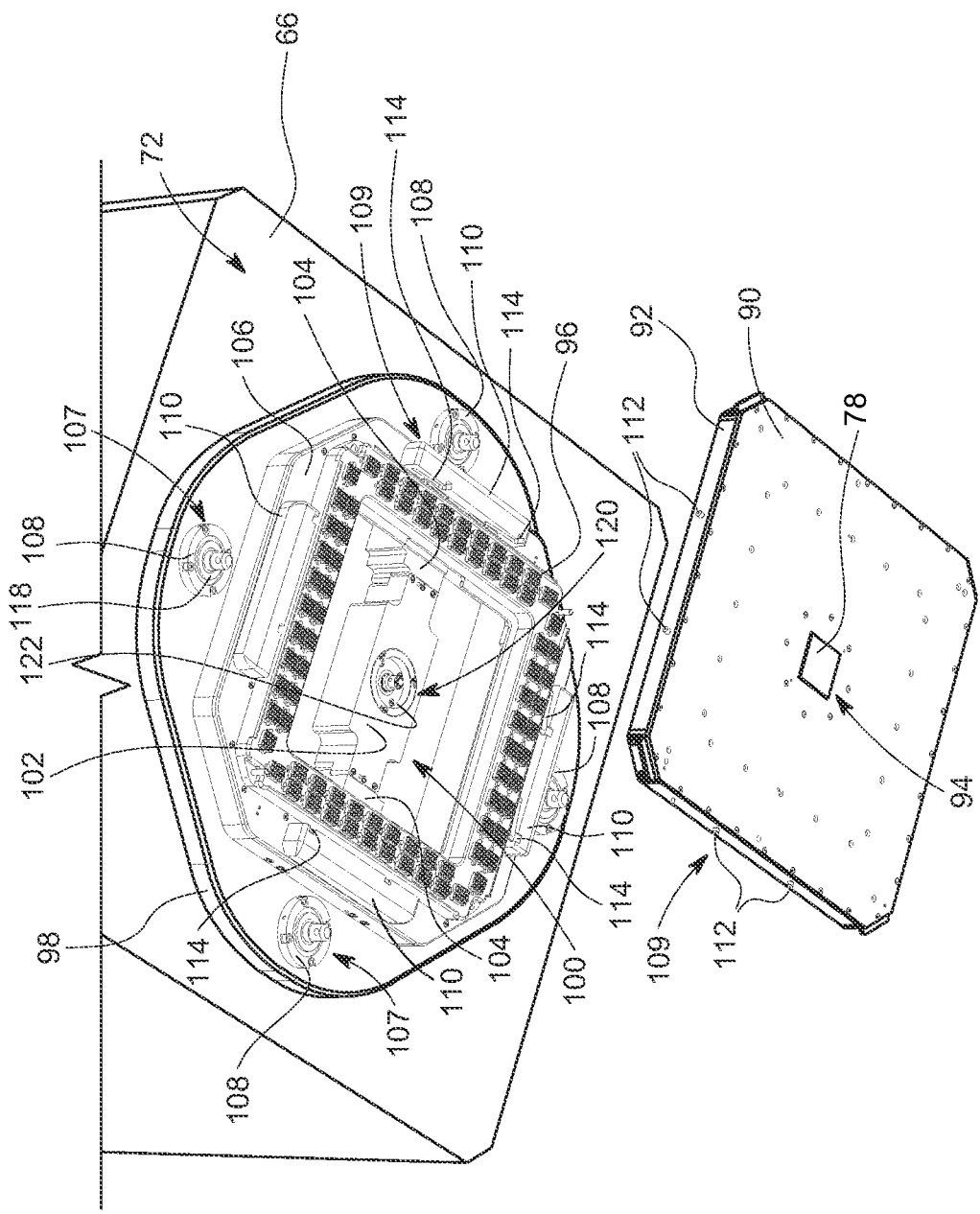
FIG. 3 is a bottom perspective view of the test head and the probe card in FIGS. 1-2. The test head includes a probe card support apparatus configured to support and planarize at least a portion of the probe card.
Figure 4:
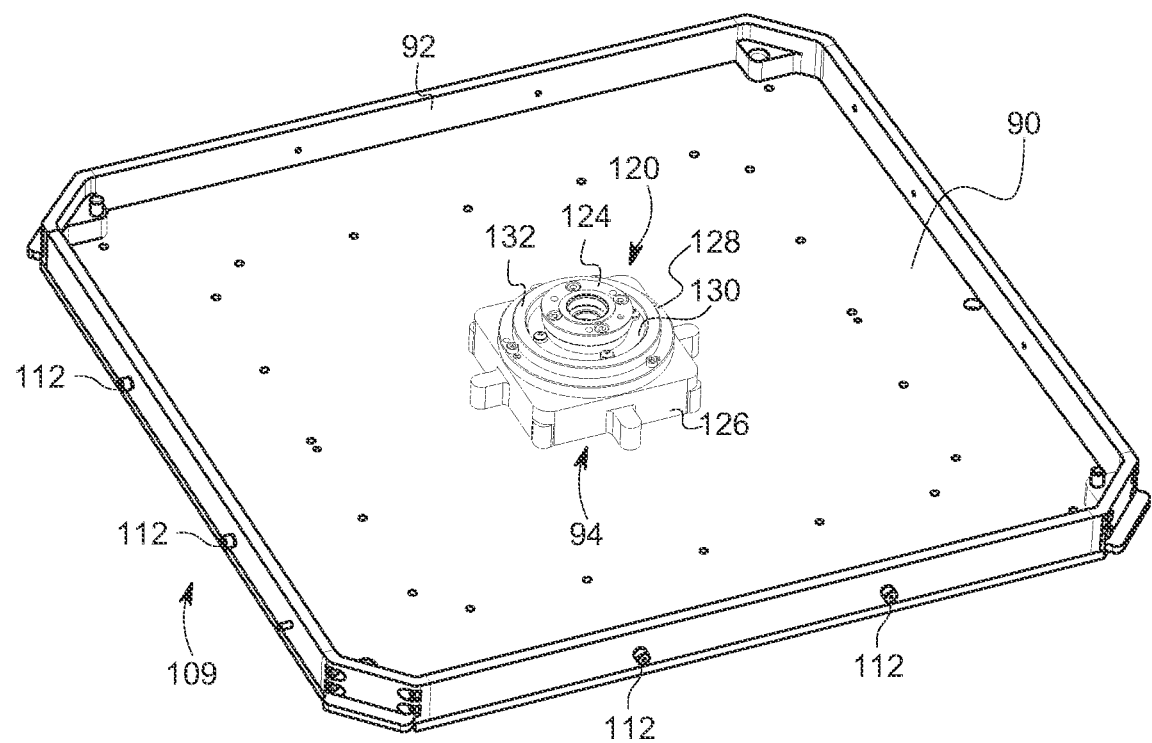
FIG. 4 is a top perspective view of one implementation of a probe card including a portion of a fastener used to couple the probe card to the probe card support apparatus.

Referring to FIG. 3, the test head 66 includes a docking frame 98 (alternatively referred to as a tester docking frame) and a probe card support apparatus 100 (alternatively referred to as a probe card support component or a probe card support device) positioned approximately in the center of the test head 66. The probe card support apparatus 100 is coupled to and extends between opposite sides of the docking frame 98. The probe card support apparatus 100 extends over and provides stiffening support and planarization to the DUT area 94 of the probe card 56. In some implementations, the probe card support apparatus 100 is easily removable from the test head 66.

In this implementation, the probe card support apparatus 100 can be thought of conceptually as a beam or plate extending from opposite sides of the docking frame 98 over the DUT area 94 of the probe card 56. The probe card support apparatus 100 includes a center portion 102 (alternatively referred to as a center beam) and ends 104 (alternatively refer to as beam ends). The center portion 102 is coupled to and extends between the ends 104 and is positioned over the DUT area 94. The ends 104 are coupled to opposite sides of the docking frame 98. The center portion 102 is coupled to the ends 104 and the ends 104 are coupled to the docking frame 98 using fasteners such as bolts, screws, and the like.

The probe card support apparatus 100 can include a highly planar bottom surface that is configured to contact the probe card 56. The highly planar bottom surface serves to planarize the probe card 56 relative to the test head 66, or, more specifically, planarize the DUT area 94 of the probe card 56 relative to the test head 66.

In some implementations, the probe card support apparatus 100 is fastened to the probe card 56 with at least one fastener 120. The fastener 120 is positioned over the DUT area 94 to provide stiffening support and planarization specifically to that area but also to the probe card 56. This holds DUT area 94 at a very consistent, repeatable, planar location. Also, positioning the fastener 120 over the DUT area 94, which is the area of the probe card 56 that should be positioned with the greatest precision, means that it is less important whether the perimeter of the probe card 56 is held as precisely.

The fastener 120 includes a first component 122 that is part of the probe card support apparatus 100 and a second component 124 that is part of the probe card 56.

In some implementations, the second component 124 can be coupled to the probe card 56 in a floating manner, or, in other words, in a manner that allows the second component 124 to move side to side but not toward or away from the probe card 56. The ability of the second component 124 to move side to side on the probe card 56 makes it easier to align it with the first component 122 when coupling the probe card 56 to the test head 66.

The second component 124 can be coupled to the probe card 56 in a floating manner using a bracket 126, a cap 128, and a floating retainer 130. The bracket 126 is attached to the probe card 56. The cap 128 is attached to the top of the bracket 126. The floating retainer 130 is attached to the cap 128 with bushing sleeves so that the floating retainer 130 can move side to side underneath the cap 128 but not toward or a way from the probe card 56. This allows proper alignment of first and second components 122, 124 in the lateral direction while maintaining a reliable, repeatable, connection in the other direction.

In some implementations the bracket 126 is custom designed for each probe card 56. This is done to allow the other components such as the cap 128 and the floating retainer 130 to remain the same for different probe cards 56.

The fastener 120 can be any suitable fasteners such as any of those described below in the section describing joining and fastening. The fastener 120 can use any suitable method to couple the first and second components 122, 124 together. For example, in some implementations, the fastener 120 can be pneumatically, hydraulically, or electrically actuated to couple the first and second components 122, 124 together. In some implementations, the fastener 120 is a clamp and the first component 122 is a clamp base having a projection and the second component 124 is a clamp head configured to receive the projection on the clamp base.

The DUT area 94 on the probe card 56 can be planarized relative to the probe card support apparatus 100 and/or the test head 66 in any suitable manner. In some implementations, the probe card support apparatus 100 and the probe card 56 each include corresponding planar surfaces 132. For example, the planar surface 132 can be on a fastener sleeve 134 that is part of the fastener 120 or part of the probe card support apparatus 100. The planar surface 132 on the probe card 56 can be on an outer surface of the cap 128. When the probe card 56 is coupled to the probe card support apparatus 100, the planar surfaces 132 contact each other thereby planarizing the DUT area 94 and the probe card support apparatus 100 relative to each other.

In some implementations, the fastener 120 can be used to planarize the DUT area 94 relative to the probe card support apparatus 100, the test head 66, and, ultimately, the wafer chuck 74. In some implementations, the first component 122 and the second component 124 each include corresponding planar surfaces. When the first and second components 122, 124 are fastened together, the planar surfaces are brought into contact with each other thereby planarizing the DUT area 94 and the probe card support apparatus 100 relative to each other and, accordingly, planarizing the probe card 56 relative to the test head 66.

The probe card support apparatus 100 should be sufficiently strong to effectively support and stiffen the probe card 56 during testing. In some implementations, the probe card support apparatus 100 is relatively thick to provide the required mechanical strength. The probe card support apparatus 100 can be made of any suitable material such as metal, ceramic, and/or metal ceramic composites (cermet).

It should be appreciated that the Figs. show one implementation of the probe card support apparatus 100 and that it can be implemented in numerous other ways. For example, in some implementations, the probe card support apparatus 100 can be a single integral piece that extends from the opposite sides of the docking frame 98. In other implementations, the probe card support apparatus 100 is an integral part of the test head 66. Also, in some implementations, the probe card support apparatus 100 can have a different shape such as the general shape of a plate which is coupled to and extends outward from two, three, or four sides of the docking frame 98.

The docking frame 98 includes a probe card locking frame 106 (alternatively referred to as a probe card support frame) and fasteners 107. The probe card locking frame 106 receives and holds the probe card 56 using fasteners 109 that latch onto or engage the probe card 56.

The fasteners 109 each include a latch or first component 110 having one or more internal channels 114 (FIGS. 3, 8-9) configured to receive one or more corresponding projections or second components 112 extending outward from the probe card frame 92. The channels 114 extend vertically upward in the latches 110 and then transition to extending horizontally at a slight upward sloping angle. The latches 110 are slidably coupled to the probe card locking frame 106 so that the latches 110 can move sideways relative to the test head 66 but not move toward or away from the test head 66. For example, in some implementations, the latches 110 are rigidly connected to the probe card locking frame 106 in a manner that prevents rotation and only allows lateral movement along one axis. This makes it so the latches 110 can slide along the one axis relative to the test head 66 while otherwise being fixed (rotationally and on the other axes) to the test head 66.

Figure 9:
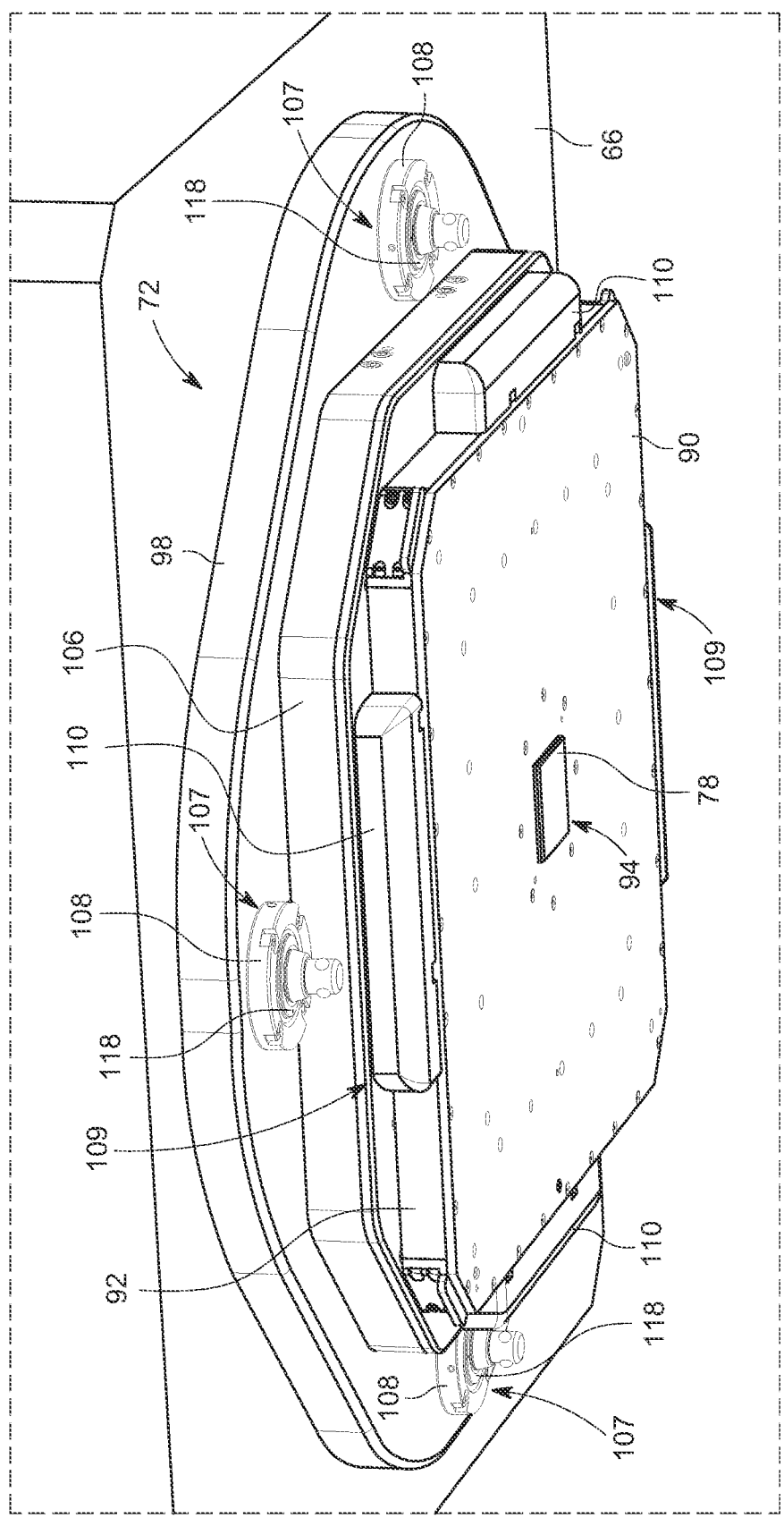
FIG. 9 is a bottom perspective view of one implementation of the probe card coupled to the bottom side of a test head.

The probe card 56 is coupled to the probe card locking frame 106 as follows. The probe card 56 is positioned adjacent to the probe card locking frame 106 so that the projections 112 extend upward into the vertical portion of the channels 114. The latches 110 are moved linearly so that the horizontal ramp portion of the channels 114 engage the projections 112 and bias them towards the probe card locking frame 106. This draws the probe card 56 tightly against the probe card locking frame 106 as shown in FIGS. 6 and 9. The latches 110 are then fixed in place pneumatically or with fasteners such as set screws or the like. The probe card 56 is now firmly coupled to the test head 66.

It should be appreciated that the procedure to couple the probe card 56 to the test head 66 may differ depending on whether the wafer prober 54 is top-load or bottom-load. If the wafer prober 54 loads from the top, then the probe card 56 is coupled to the test head 66 and the test head 66 is coupled to the wafer prober 54. If the wafer prober 54 loads from the bottom, then the test head 66 is coupled to the wafer prober 54 and the probe card 56 is loaded through the bottom/front of the wafer prober 54 and coupled to the test heat 66.

In some implementations, the latches 110 are cam-ramp latches and the projections 112 are cam-rollers. The cam-ramp latches bias the cam rollers using the same channel configuration described above. This pulls the probe card 56 tightly against the probe card locking frame 106 as shown in FIGS. 6 and 9. Although the latches 110 are shown on the probe card locking frame 106 and the projections 112 are on the probe card 56, it should be appreciated that in other implementations, the latches 110 can be positioned on the probe card 56 and the projections 112 can be positioned on the probe card locking frame 106.

It should be appreciated that any suitable fasteners 109 can be used to couple the probe card 56 to the test head 66.

Examples of suitable fasteners 109 include any of those described below in the section describing joining and fastening.

It should also be appreciated that the test head 66 and the probe card 56 can interface with each other in other ways besides what is shown in the Figs. For example, the manner in which the probe card 56 and the test head 66 are coupled together can be altered in numerous ways. Also, in some implementations, the probe card 56 can also be coupled to the wafer prober 54. Numerous changes are possible to the way the probe card 56 is coupled to the test head and/or the wafer prober 54.

The fasteners 107 are used to couple the test head 66 to the wafer prober 54. In the implementation shown in the Figs., each fastener 107 includes a first component 108 coupled to the docking frame 98 and a second component 111 coupled to a prober insert plate 116 in the prober top plate 76 of the wafer prober 54. Proper alignment of the first component 108 and the second component 111 is achieved by precision machining the docking frame 98 and the prober insert plate 116 or by using a setup alignment tool (not shown).

The fasteners 107 can be any suitable fasteners such as any of those described below in the section describing joining and fastening. The fasteners 107 can use any suitable method to couple the first and second components 108, 111 together. For example, in some implementations, the fasteners 107 can be pneumatically, hydraulically, or electrically actuated to couple the first and second components 108, 111 together. In some implementations, the fasteners 107 are clamps and the first component 108 is a clamp base having a projection and the second component 111 is a clamp head configured to receive the projection on the clamp base.

In some implementations, the fasteners 107 can be used to planarize the test head 66 relative to the wafer prober 54. This can be accomplished in a number of ways. In some implementations, the first component 108 and the second component 111 each include corresponding planar surfaces 118. When the first and second components 108, 111 are fastened together, the planar surfaces 118 are brought into contact with each other thereby planarizing the docking frame 98 and the prober insert plate 116 relative to each other and, accordingly, planarizing the test head 66 relative to the wafer prober 54.

In other implementations, the test head 66 and/or the wafer prober 54 can include planar surfaces that are separate from the fasteners 107 and function to planarize the test head 66 relative to the wafer prober 54.

The DUT area 94 on the probe card 56 can be aligned to the DUT on the wafer 58 using the various planar surfaces. The DUT area 94 on the probe card 56 is planarized relative to the test head 66 using the corresponding planar surfaces 132 on the probe card 56 and the probe card support apparatus 100. The test head 66 is planarized relative to the prober top plate 76 using the corresponding planar surfaces 118 on the fasteners 107. The prober top plate 76 is planarized relative to the top surface of the wafer chuck 74.

Figure 10:
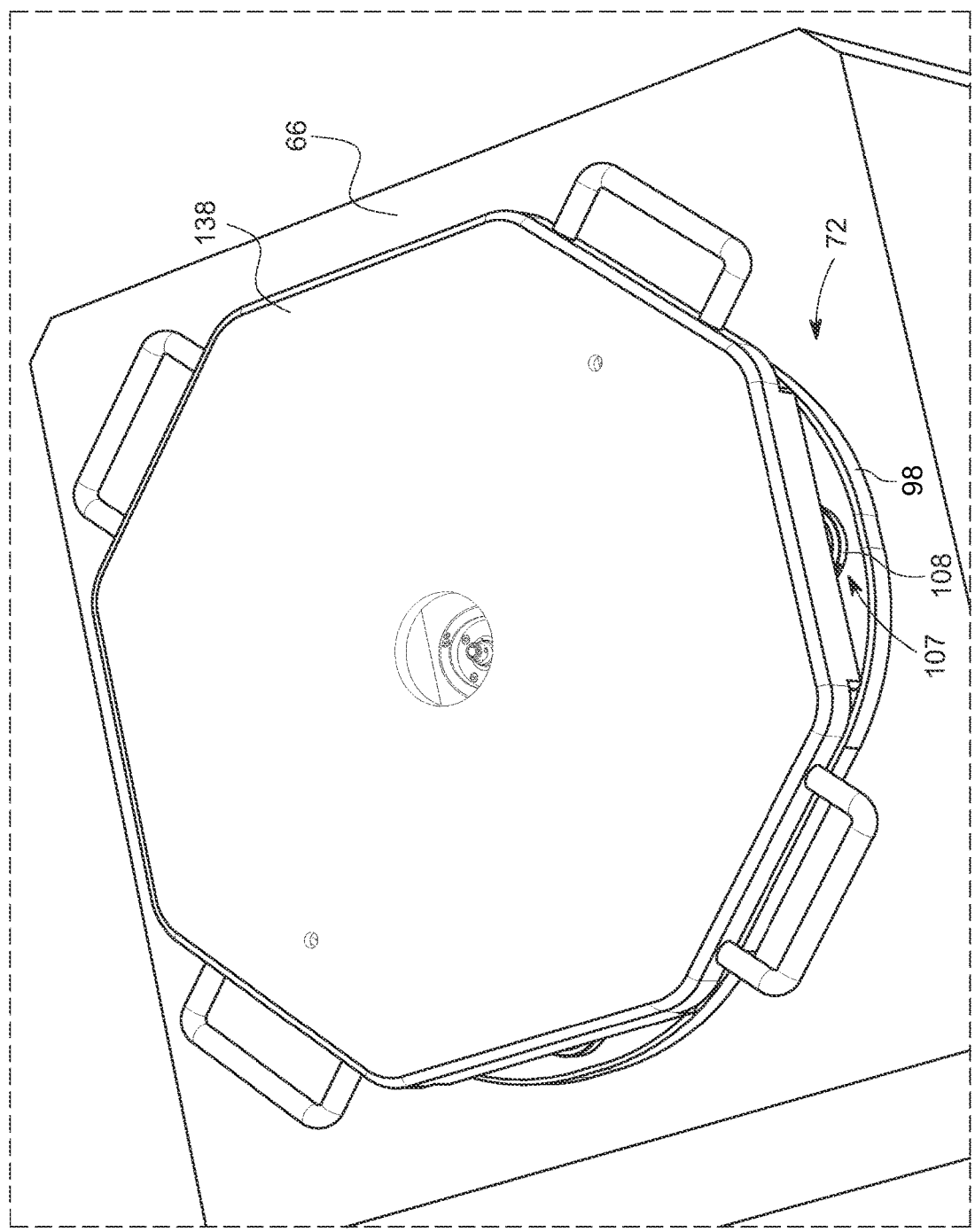
FIG. 10 is a bottom perspective view of one implementation of a planarization tool coupled to the bottom side of a test head.

In some implementations, the process for planarizing the DUT area 94 to the wafer chuck 74 includes one or more of the following steps. The first step is to planarize the tilt of the planar surface 132 on the fastener sleeve 134. This is done by attaching a planarization tool 138 to the test head 66 as shown in FIG. 10. The planarization tool 138 is a precision machined part configured to attach to the fasteners 107. The planarization tool includes planar surfaces 118 that correspond to the planar surfaces 118 on the first component 108 of the fasteners 107.

The next step is to measure the distance from the planarization tool 138 to the planar surface 132 around the circumference of the fastener sleeve 134 using a depth gauge or other tool. The mounting screws and set screws for the fastener sleeve 134 are adjusted until the planar surface 132 is not tilted relative to the planarization tool 138. This procedure provides accurate planarity between the planar surface 132 on the fastener sleeve 134 and planar surfaces 118 on the fasteners 107.

The next step is to adjust the planarization points on the prober top plate 76 to planarize the prober top plate 76 to the wafer chuck 74. The prober insert plate 116 is a precision machined part that is highly accurate in planarity. Positioning it in the prober top plate 76 provides accurate planarity between the wafer chuck 74 and the planar surfaces 118 on the fasteners 107.

Figure 7:
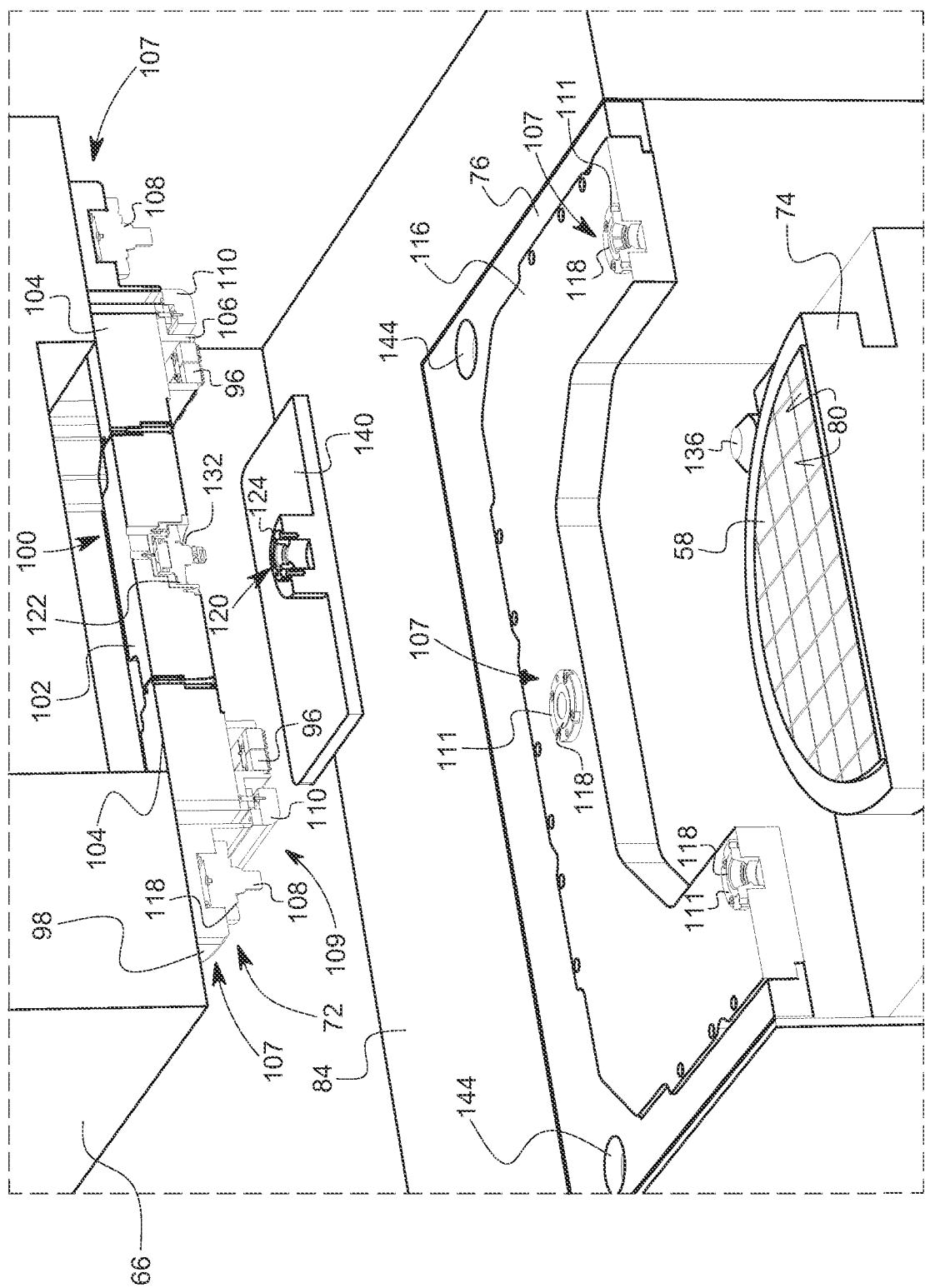
FIG. 7 is a cross-sectional, perspective view of one implementation of automatic test equipment including a test head, a planarization gauge, and a wafer prober. The planarization gauge can be used to planarize the probe card relative to the test head.
Figure 8:
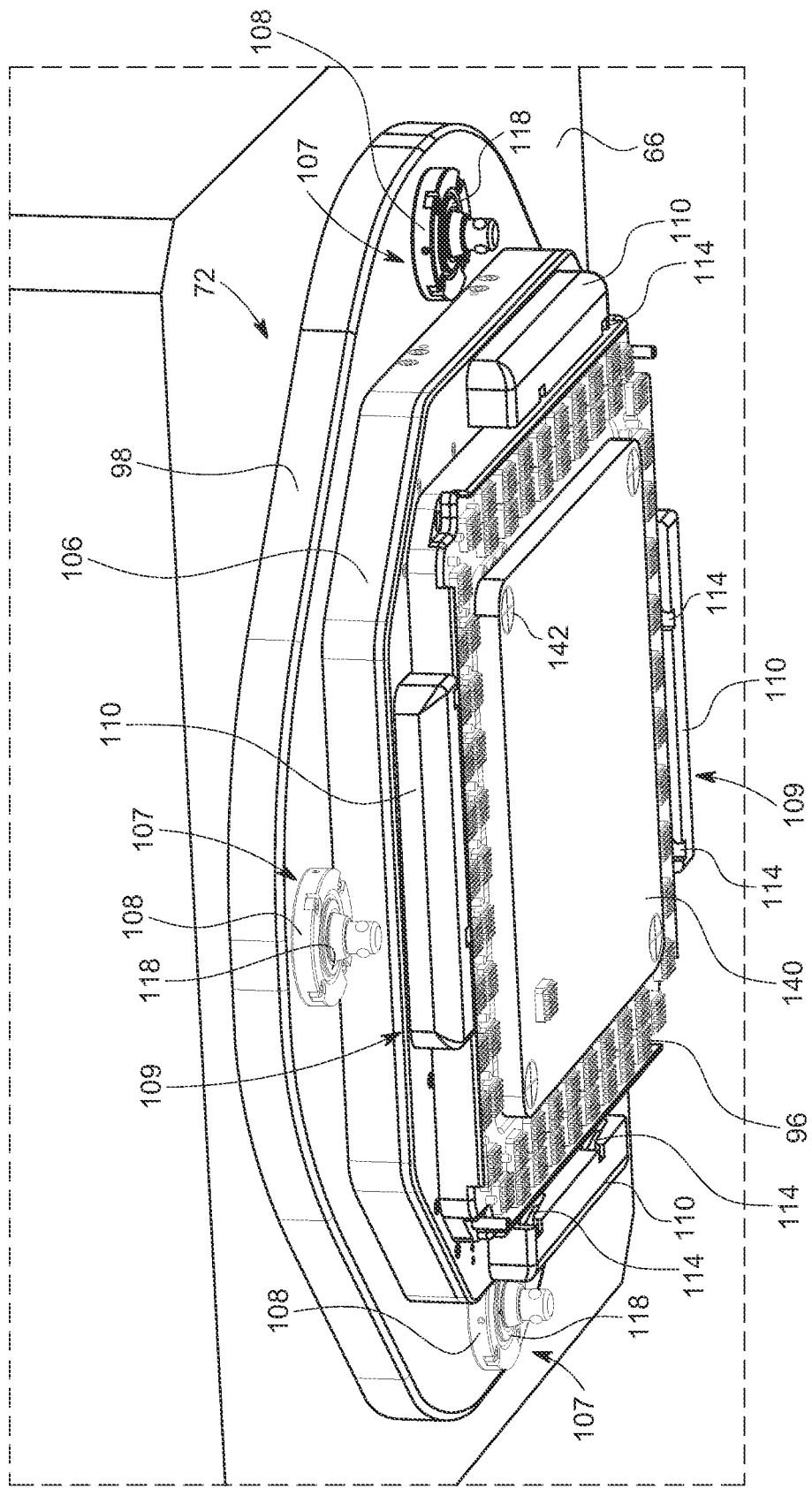
FIG. 8 is a bottom perspective view of the test head and planarization gauge in FIG. 7. The planarization gauge is shown coupled to the bottom side of the test head.

A planarization gauge 140 is attached to the fastener 120 of the probe card support apparatus 100 (FIGS. 7-8). The planarization gauge 140 is a precision machined part having a second component 124 of the fastener 120 positioned in the center. The planarization gauge 140 has fiducial marks 142 on it. The test head 66 is coupled to the wafer prober 54 using the fasteners 107. The upward looking camera 136 in the wafer prober 54 focuses on the fiducial marks 142 on the planarization gauge 140. The prober top plate planarization points 144 are adjusted using very fine adjustments to planarize fiducial surface of the planarization gauge 140 to the wafer chuck 74.

The end result is that the fastener 120 in the center of the test head 66 is planar with the wafer chuck 74, which then results in the probe card center DUT area 94 being precisely planar with the wafer chuck 74. It is especially desirable for the probe card center DUT area 94 to be precisely planar with the wafer chuck 74 so the probe card 56 can make proper electrical and mechanical contact with the wafer 58 when it is sitting on the wafer chuck 74.

Illustrative Implementations

The following is a description of various implementations of the disclosed subject matter. Each implementation may include one or more of the various features, characteristics, or advantages of the disclosed subject matter. The implementations are intended to illustrate a few aspects of the disclosed subject matter and should not be considered a comprehensive or exhaustive description of all possible implementations.

P1. A test head comprising: a probe card support apparatus; wherein the probe card support apparatus is configured to be positioned over a device under test (DUT) area of a probe card and provide stiffening support and planarization to the DUT area of the probe card; and wherein the test head is configured to be used with an automated test system to test electronic components.

P2. The test head of paragraph P1 comprising a probe card locking frame, wherein the probe card support apparatus is positioned in a center area of the probe card locking frame.

P3. The test head of any one of paragraphs P1 to P2 wherein the probe card support apparatus is configured to be connected to the probe card over the DUT area.

P4. The test head of any one of paragraphs P1 to P3 wherein the probe card support apparatus comprises a clamp configured to be positioned over the DUT area of the probe card and connect the probe card support apparatus to the probe card.

P5. The test head of any one of paragraphs P1 to P4 wherein the probe card support apparatus comprises a planar surface configured to contact an opposing planar surface on the probe card and planarize the test head relative to the probe card.

P6. The test head of any one of paragraphs P1 to P5 wherein the test head comprises a clamp configured to connect the test head to a wafer prober.

P7. The test head of any one of paragraphs P1 to P6 wherein the test head includes a planar surface configured to contact an opposing planar surface on the wafer prober to planarize the test head relative to a wafer chuck in the wafer prober.

P8. The test head of any one of paragraphs P1 to P7 wherein the probe card support apparatus includes a beam configured to extend over the DUT area of the probe card.

P9. A system comprising: a test head comprising: a probe card support apparatus; and a probe card coupled to the test head, the probe card having a device under test (DUT) area; wherein the probe card support apparatus is positioned over and provides stiffening support and planarization to the DUT area of the probe card.

P10. The test head of paragraph P9 comprising a probe card locking frame, wherein the probe card support apparatus is positioned in a center area of the probe card locking frame.

P11. The system of any one of paragraphs P9 to P10 wherein the probe card support apparatus is connected to the probe card over the DUT area.

P12. The system of any one of paragraphs P9 to P11 comprising a clamp positioned over the DUT area of the probe card and connecting the probe card support apparatus and the probe card.

P13. The system of any one of paragraphs P9 to P12 comprising: a clamp connecting the test head and the probe card, the clamp comprising: a first component coupled to the test head; and a second component coupled to the probe card; wherein at least one of the first component or the second component is movable sideways relative to the test head or the probe card, respectively, and not movable toward or away from the test head or the probe card, respectively.

P14. The system of any one of paragraphs P9 to P13 wherein the probe card support apparatus includes a planar surface and the probe card includes a planar surface, and wherein the planar surface on the probe card support apparatus contacts the planar surface on the probe card to planarize the test head and the probe card relative to each other.

P15. The system of any one of paragraphs P9 to P14 wherein the probe card has an area of at least 150 in$^2$.

P16. The system of any one of paragraphs P9 to P15 wherein the test head comprises a probe card locking frame and wherein the probe card is coupled to the probe card locking frame.

P17. A system comprising: a wafer prober; a probe card coupled to the wafer prober, the probe card having a device under test (DUT) area; a probe card support apparatus extending over and providing stiffening support and planarization to the DUT area of the probe card; wherein the wafer prober is a top loading wafer prober.

P18. The system of paragraph P17 comprising a clamp connecting the test head and a wafer prober.

P19. The system of paragraph P18 wherein the test head includes a tester docking frame and the wafer prober includes a prober insert plate, and wherein the clamp connects the tester docking frame and the prober insert plate.

P20. The system of any one of paragraphs P17 to P19 wherein the test head includes a planar surface and the wafer prober includes a planar surface, and wherein the planar surface on the test head contacts the planar surface on the wafer prober to planarize the DUT area and a wafer chuck in the wafer prober relative to each other.

P21. A system for supporting a probe card attached to an automated test system. An apparatus for use with a probe card and an automated test system comprising a probe card support apparatus attached to the center area of the test head that clamps to a clamp head which is formed at the center area of the probe card and provides stiffening support and planarization for the probe card. The supporting apparatus is attached to the test head and the supporting apparatus is comprised of a center clamp apparatus having a feature defining a first plane. The center clamp head is mountable atop the center portion of the probe card and the center clamp head having a feature defining a second plane. When the feature of the clamp defining the first plane is urged against the feature of the reference member defining a second plane the probe tips of the probe card are substantially planarized relative to the test head. The test head is comprised of a plurality of outer clamps having a feature defining a third plane. The wafer prober is comprised of a plurality of outer clamp heads having a feature defining a fourth plane. When the feature of the clamp defining the third plane is urged against the feature of the reference member defining a fourth plane the test head is substantially planarized relative to the wafer prober and wafer chuck. Because the supporting apparatus is attached to the test head, instead of to the wafer prober, it therefor allows the probe card to be installed from the top of the wafer prober as well as from the bottom of the wafer prober.

General Terminology and Interpretative Conventions

Any methods described in the claims or specification should not be interpreted to require the steps to be performed in a specific order unless expressly stated otherwise. Also, the methods should be interpreted to provide support to perform the recited steps in any order unless expressly stated otherwise.

Certain features described in the context of separate implementations can also be implemented in combination in a single implementation. Conversely, various features that are described in the context of a single implementation can also be implemented in multiple implementations separately or in any suitable subcombination. Moreover, although features may be described above in certain combinations and even initially claimed as such, one or more features from a claimed combination can be excised from the combination, and the claimed combination may be directed to a subcombination or variation of a subcombination.

Articles such as "the," "a," and "an" can connote the singular or plural. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items.

The terms have, having, include, and including should be interpreted to be synonymous with the terms comprise and comprising. The use of these terms should also be understood as disclosing and providing support for narrower alternative implementations where these terms are replaced by "consisting" or "consisting essentially of."

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should be construed in light of the number of recited significant digits and by applying ordinary rounding techniques.

All disclosed ranges are to be understood to encompass and provide support for claims that recite any subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth), which values can be expressed alone or as a minimum value (e.g., at least 5.8) or a maximum value (e.g., no more than 9.9994).

All disclosed numerical values are to be understood as being variable from 0-100% in either direction and thus provide support for claims that recite such values (either alone or as a minimum or a maximum—e.g., at least <value> or no more than <value>) or any ranges or subranges that can be formed by such values. For example, a stated numerical value of 8 should be understood to vary from 0 to 16 (100% in either direction) and provide support for claims that recite the range itself (e.g., 0 to 16), any subrange within the range (e.g., 2 to 12.5) or any individual value within that range expressed individually (e.g., 15.2), as a minimum value (e.g., at least 4.3), or as a maximum value (e.g., no more than 12.4).

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

The subject matter recited in the claims is not coextensive with and should not be interpreted to be coextensive with any implementation, feature, or combination of features described or illustrated in this document. This is true even if only a single implementation of the feature or combination of features is illustrated and described.

Joining or Fastening Terminology and Interpretative Conventions

The term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

The term "coupled" includes joining that is permanent in nature or releasable and/or removable in nature. Permanent joining refers to joining the components together in a manner that is not capable of being reversed or returned to the original condition. Releasable joining refers to joining the components together in a manner that is capable of being reversed or returned to the original condition.

Releasable joining can be further categorized based on the difficulty of releasing the components and/or whether the components are released as part of their ordinary operation and/or use. Readily or easily releasable joining refers to joining that can be readily, easily, and/or promptly released with little or no difficulty or effort. Difficult or hard to release joining refers to joining that is difficult, hard, or arduous to release and/or requires substantial effort to release. The joining can be released or intended to be released as part of the ordinary operation and/or use of the components or only in extraordinary situations and/or circumstances. In the latter case, the joining can be intended to remain joined for a long, indefinite period until the extraordinary circumstances arise.

It should be appreciated that the components can be joined together using any type of fastening method and/or fastener. The fastening method refers to the way the components are joined. A fastener is generally a separate component used in a mechanical fastening method to mechanically join the components together. A list of examples of fastening methods and/or fasteners are given below. The list is divided according to whether the fastening method and/or fastener is generally permanent, readily released, or difficult to release.

Examples of permanent fastening methods include welding, soldering, brazing, crimping, riveting, stapling, stitching, some types of nailing, some types of adhering, and some types of cementing. Examples of permanent fasteners include some types of nails, some types of dowel pins, most types of rivets, most types of staples, stitches, most types of structural ties, and toggle bolts.

Examples of readily releasable fastening methods include clamping, pinning, clipping, latching, clasping, buttoning, zipping, buckling, and tying. Examples of readily releasable fasteners include snap fasteners, retainer rings, circlips, split pin, linchpins, R-pins, clevis fasteners, cotter pins, latches, hook and loop fasteners (VELCRO), hook and eye fasteners, push pins, clips, clasps, clamps, zip ties, zippers, buttons, buckles, split pin fasteners, and/or conformat fasteners.

Examples of difficult to release fastening methods include bolting, screwing, most types of threaded fastening, and some types of nailing. Examples of difficult to release fasteners include bolts, screws, most types of threaded fasteners, some types of nails, some types of dowel pins, a few types of rivets, a few types of structural ties.

It should be appreciated that the fastening methods and fasteners are categorized above based on their most common configurations and/or applications. The fastening methods and fasteners can fall into other categories or multiple categories depending on their specific configurations and/or applications. For example, rope, string, wire, cable, chain, and the like can be permanent, readily releasable, or difficult to release depending on the application.

Drawing Related Terminology and Interpretative Conventions

The drawings are intended to illustrate implementations that are both drawn to scale and/or not drawn to scale. This means the drawings can be interpreted, for example, as showing: (a) everything drawn to scale, (b) nothing drawn to scale, or (c) one or more features drawn to scale and one or more features not drawn to scale. Accordingly, the drawings can serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that can be formed by such values.

Spatial or directional terms, such as "left," "right," "front," "back," and the like, relate to the subject matter as it is shown in the drawings and/or how it is commonly oriented during manufacture, use, or the like. However, it is to be understood that the described subject matter may assume various alternative orientations and, accordingly, such terms are not to be considered as limiting.

The invention claimed is:

1. A test head comprising:
a docking frame configured to receive and hold a probe card; and
a probe card support apparatus coupled to and extending between opposite sides of the docking frame, the probe card support apparatus being configured to be positioned over and provide stiffening support and planarization to the DUT area of the probe card, the probe card support apparatus including:
a planar surface on the bottom of the probe card support apparatus; and
a fastener positioned on the bottom of the probe card support apparatus, the fastener being configured to connect the probe card support apparatus to the probe card;
wherein the planar surface is configured to contact the probe card and provide stiffening support and planarization to the probe card;
wherein the test head is configured to be used with an automated test unit to test electronic components.

2. The test head of claim 1 wherein the docking frame includes a probe card locking frame, wherein the probe card support apparatus is positioned in a center area of the probe card locking frame.

3. The test head of claim 1 wherein the the fastener is configured to be positioned over the DUT area of the probe card.

4. The test head of claim 1 wherein the planar surface is a first planar surface and wherein the fastener comprises a second planar surface configured to contact an opposing planar surface on the probe card and planarize the test head relative to the probe card.

5. The test head of claim 1 wherein the fastener is a first fastener and wherein the test head comprises a second fastener configured to connect the test head to a wafer prober.

6. The test head of claim 1 wherein the planar surface is a first planar surface and wherein the test head includes a second planar surface configured to contact an opposing planar surface on the wafer prober to planarize the test head relative to a wafer chuck in the wafer prober.

7. The test head of claim 1 wherein the probe card support apparatus includes a beam configured to extend over the DUT area of the probe card and wherein the planar surface and the fastener are on the bottom of the beam.

8. The test head of claim 1 wherein the test head is configured to move between: (a) a first position where the test head and the probe card are coupled together and the probe card support apparatus is positioned over and provides stiffening support and planarization to the DUT area of the probe card and (b) a second position where the test head and the probe card are not coupled together and the probe card support apparatus is not positioned over and does not provide stiffening support and planarization to the DUT area of the probe card.

9. The test head of claim 8 wherein the probe card support apparatus is part of the test head and not the probe card when the test head is in the second position.

10. The test head of claim 1 wherein the probe card support apparatus is part of the test head when the test head and the probe card are separated.

11. A system comprising:
a test head including:
a docking frame; and
a probe card support apparatus coupled to and extending between opposite sides of the docking frame, the probe card support apparatus including:
a planar surface on the bottom of the probe card support apparatus; and
a fastener positioned on the bottom of the probe card support apparatus;
a probe card coupled to the docking frame with the fastener, the probe card having a device under test (DUT) area;
wherein the probe card support apparatus is positioned over and provides stiffening support and planarization to the DUT area of the probe card; and
wherein the planar surface contacts the probe card and provides stiffening support and planarization to the probe card.

12. The test head of claim 11 wherein the docking frame includes a probe card locking frame, wherein the probe card support apparatus is positioned in a center area of the probe card locking frame.

13. The system of claim 11 wherein the fastener is connected to the probe card over the DUT area of the probe card.

14. The system of claim 11 wherein the fastener comprises:
a first component coupled to the docking frame; and
a second component coupled to the probe card;
wherein at least one of the first component or the second component is movable sideways relative to the docking frame or the probe card, respectively, and not movable toward or away from the docking frame or the probe card, respectively.

15. The system of claim 11 wherein the probe card includes a planar surface, and wherein the planar surface on the probe card support apparatus contacts the planar surface on the probe card to planarize the test head and the probe card relative to each other.

16. The system of claim 11 wherein the probe card has an area of at least 150 in$^2$.

17. The system of claim 11 wherein the docking frame comprises a probe card locking frame and wherein the probe card is coupled to the probe card locking frame.

18. The system of claim 11 wherein the test head is movable between (a) a first position where the test head and the probe card are coupled together and the probe card support apparatus is positioned over and provides stiffening support and planarization to the DUT area of the probe card and (b) a second position where the test head and the probe card are not coupled together and the probe card support apparatus is not positioned over and does not provide stiffening support and planarization to the DUT area of the probe card.

19. The system of claim 18 wherein the probe card support apparatus is part of the test head and not the probe card when the test head is in the second position.

20. The system of claim 11 wherein the probe card support apparatus is part of the test head when the test head and the probe card are separated.

21. A system comprising:
a wafer prober;
a probe card coupled to the wafer prober, the probe card having a device under test (DUT) area; and
a test head coupled to the wafer prober and the probe card, the test head including:
a docking frame; and
a probe card support apparatus coupled to and extending between opposite sides of the docking frame, the probe card support apparatus extending over and providing stiffening support and planarization to the DUT area of the probe card, the probe card support apparatus including:
a planar surface on the bottom of the probe card support apparatus; and
a fastener positioned on the bottom of the probe card support apparatus, the fastener connecting the probe card support apparatus to the probe card;
wherein the planar surface contacts the probe card and provides stiffening support and planarization to the probe card;
wherein the probe card support apparatus is a separate component from the probe card.

22. The system of claim 21 wherein the fastener is a first fastener and wherein the test head is connected to the wafer prober with a second fastener.

23. The system of claim 22 wherein the wafer prober includes a prober insert plate, and wherein the second fastener connects the docking frame and the prober insert plate.

24. The system of claim 21 wherein the planar surface is a first planar surface, wherein the test head includes a second planar surface and the wafer prober includes a planar surface, and wherein the second planar surface on the test head contacts the planar surface on the wafer prober to planarize the DUT area of the probe card and a wafer chuck in the wafer prober relative to each other.

* * * * *